US012313673B2

(12) United States Patent
Zhang et al.

(10) Patent No.: US 12,313,673 B2
(45) Date of Patent: May 27, 2025

(54) WLCSP DEVICE ENCLOSURE

(71) Applicant: Silicon Laboratories Inc., Austin, TX (US)

(72) Inventors: Wenshui Zhang, Singapore (SG); Chee Teong Chang, Singapore (SG); Paul Ashley Nathan, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 85 days.

(21) Appl. No.: 18/214,090

(22) Filed: Jun. 26, 2023

(65) Prior Publication Data

US 2024/0426900 A1    Dec. 26, 2024

(51) Int. Cl.
*G01R 31/12* (2020.01)
*G01R 31/28* (2006.01)

(52) U.S. Cl.
CPC ..... *G01R 31/2862* (2013.01); *G01R 31/2865* (2013.01)

(58) Field of Classification Search
CPC .............. G01R 31/2862; G01R 31/2865
See application file for complete search history.

(56) References Cited

U.S. PATENT DOCUMENTS

| | | |
|---|---|---|
| 5,872,449 A | 2/1999 | Gouravaram et al. |
| 6,220,870 B1 * | 4/2001 | Barabi .............. H01R 13/2485 |
| | | 439/71 |
| 2010/0295572 A1 * | 11/2010 | Ryu ...................... G01R 1/0483 |
| | | 324/765.01 |
| 2017/0176493 A1 * | 6/2017 | Iy .......................... G01R 1/0483 |
| 2021/0223285 A1 * | 7/2021 | Feng ..................... H05K 1/0243 |
| 2021/0364547 A1 * | 11/2021 | Mroczkowski ........ G01R 1/045 |
| 2024/0201224 A1 * | 6/2024 | Victoria ............. G01R 31/2889 |

OTHER PUBLICATIONS

Analog Devices, "Wafer Level Chip Scale Package," Rev. D, 2007-2012, downloaded from www.analog.com on May 11, 2023, 12 pages.

* cited by examiner

*Primary Examiner* — Thang X Le
(74) *Attorney, Agent, or Firm* — Zagorin Cave LLP

(57) ABSTRACT

A device enclosure for a wafer level chip scale package (WLCSP) device that is particularly useful for package qualification testing includes a base for receiving the WLCSP device and a removable cover. The device enclosure allows testing to occur without handling of the device. The base has through holes in a center portion of a bottom of the base to allow electrical contacts of the WLCSP device to be exposed when the WLCSP device is mounted in the device enclosure. The cover attaches to the base with screws and has a plurality of openings to provide ingress of air into the device enclosure. A peripheral of the bottom of the cover is recessed from a center portion of the bottom of the cover and the center portion engages the WLCSP device to secure the WLCSP device in the device enclosure when the base and cover are secured together.

20 Claims, 9 Drawing Sheets

WLCSP DEVICE ENCLOSURE

BACKGROUND

Field of the Invention

This disclosure relates generally to device enclosures and more specifically to device enclosures for testing wafer level chip scale package devices.

Description of the Related Art

A wafer level chip scale package (WLCSP) is essentially a chip scale package that is the same size as the die. The package is smaller and thinner compared to conventional quad flat no-lead (QFN) packages. As dies sizes shrink, handling challenges of small die increase for package qualification testing. Existing test techniques use bare WLCSP parts while running package qualification testing and the small and thin package size of the WLCSP device poses handling challenges. Package qualification involves extensive and lengthy testing at various temperatures with various supply voltages and other mechanical or electrical stresses depending on the particular qualification tests required by customers. For example, military or space customers may have different qualification requirements than commercial customers. The qualification tests can last for multiple weeks or longer. If a device is damaged by handling during qualification testing, the testing has to start again from the beginning, which leads to significant delay and cost. Accordingly, it would be desirable to avoid mishandling of devices leading to damage during package qualification.

SUMMARY OF EMBODIMENTS OF THE INVENTION

In order to reduce risk of mishandling, embodiments described herein provide an enclosure to house a WLCSP device for testing.

In an embodiment a device enclosure includes a base for receiving a WLCSP device. The base includes through holes in the bottom of the base to allow electrical contacts of the WLCSP device to be exposed when the WLCSP device is mounted in the device enclosure. The device enclosure further includes a cover having a plurality of openings to provide ingress of air into the device enclosure during testing. The base and the cover are secured together by screws.

In another embodiment a device enclosure for a WLCSP device includes a base for receiving the WLCSP device. The base has through holes in a center portion of the bottom of the base to allow electrical contacts of the WLCSP device to be exposed when the WLCSP device is mounted in the device enclosure. A cover is attachable to the base and has a plurality of openings extending vertically from a top of the cover to a bottom of the cover to provide ingress of air into the device enclosure. A peripheral portion of the bottom of the cover is recessed from a center portion of the bottom of the cover and the center portion engages the WLCSP device to secure the WLCSP device in the device enclosure when the base and cover are secured together.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments herein provide a device enclosure to house a WLCSP device. The WLCSP device is inserted into the device enclosure and remains in the device enclosure through the package qualification process. That significantly reduces the need for handling very small devices and eliminates or greatly reduces the possibility of device damage caused by handling during qualification testing. Having the WLCSP device in the enclosure for the entire package qualification process means that the device enclosure should be made of material that can operate at high heat and high humidity.

Figure 1:
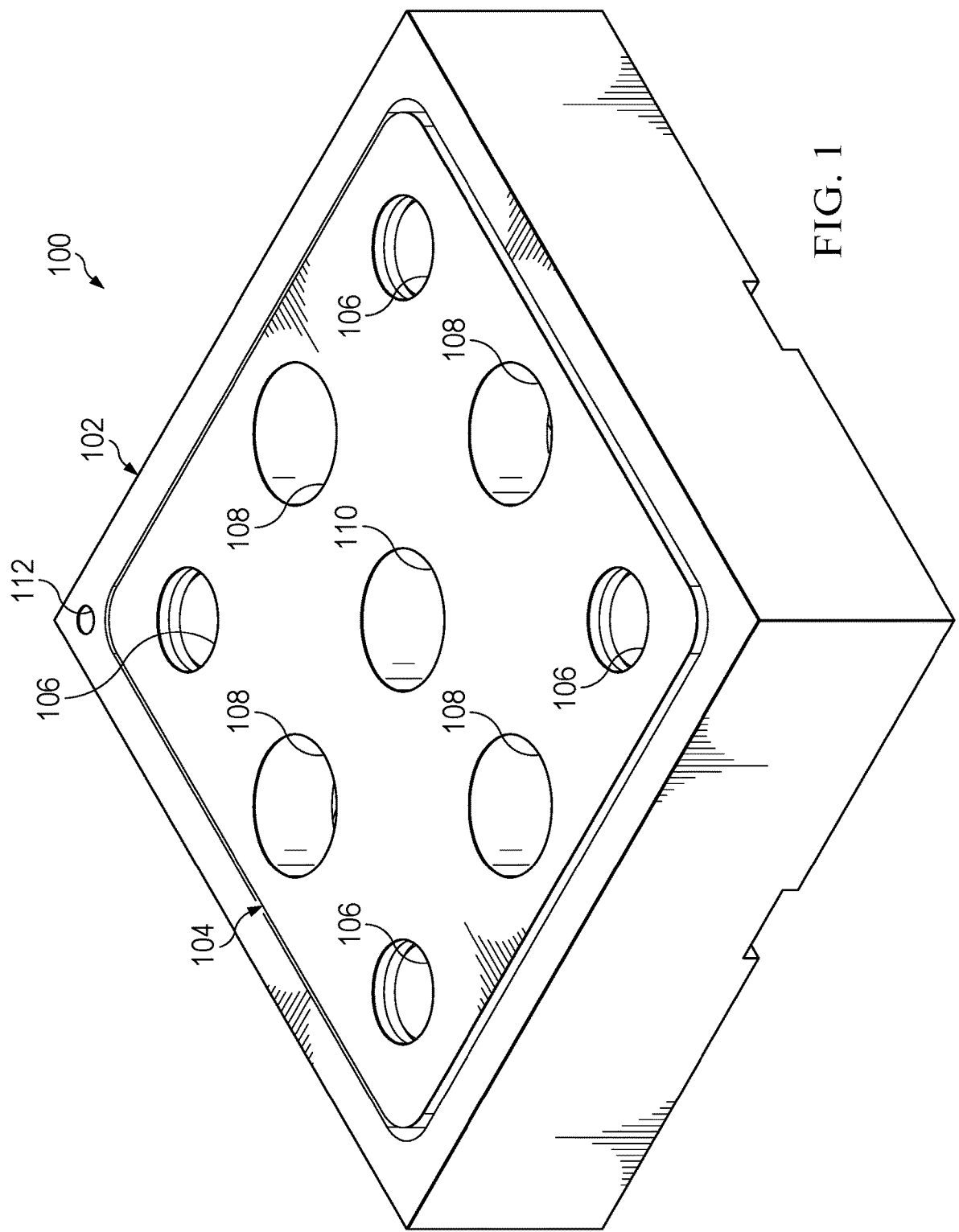
FIG. 1 illustrates a device enclosure according to an embodiment.

FIG. 1 illustrates an embodiment of device enclosure 100 that includes a base 102 and a cover 104 that are secured together once the WLCSP device is inserted into the enclosure. FIG. 1 shows the cover has four screw holes 106 that receive screws from the base to secure the cover to the base. The cover also has four air openings 108 and a center opening 110 that help ensure air and moisture ingression during qualification testing. FIG. 1 illustrates an embodiment in which the cover 104 has a square shape with rounded corners. A mark 112 on the top of the base marks the proper orientation for insertion of the WLCSP device.

Figure 2:
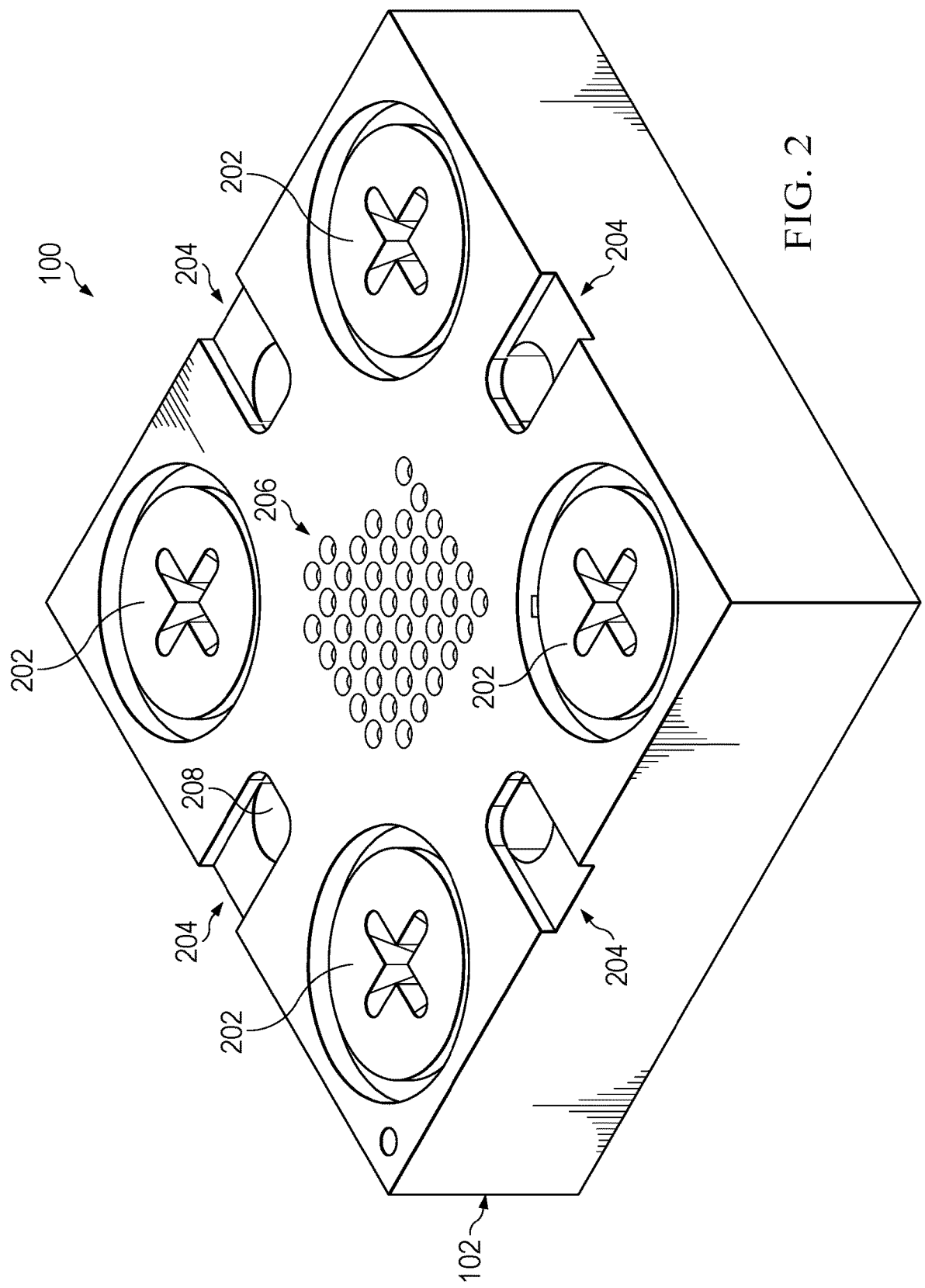
FIG. 2 illustrates the bottom of the device enclosure.

FIG. 2 illustrates the bottom of the base 102 of the device enclosure 100. FIG. 2 illustrates the four screws 202 used to secure the base 102 to the cover 104. In addition, the base 102 includes notches 204 and openings 208 formed on each side and the bottom of the base to allow air to enter the interior of the device enclosure. The notches 204 in the base and the openings 108 in the cover are configured to allow air from the notches and the openings in the cover to be in contact. The bottom of the base further includes contact holes 206 that expose the WLCSP electrical contacts to allow testing of the WLCSP device including automatic test equipment (ATE) testing without the need to take out the device under test. ATE testing can occur prior to and post qualification testing to ensure the part was initially good and is still good.

Figure 3:
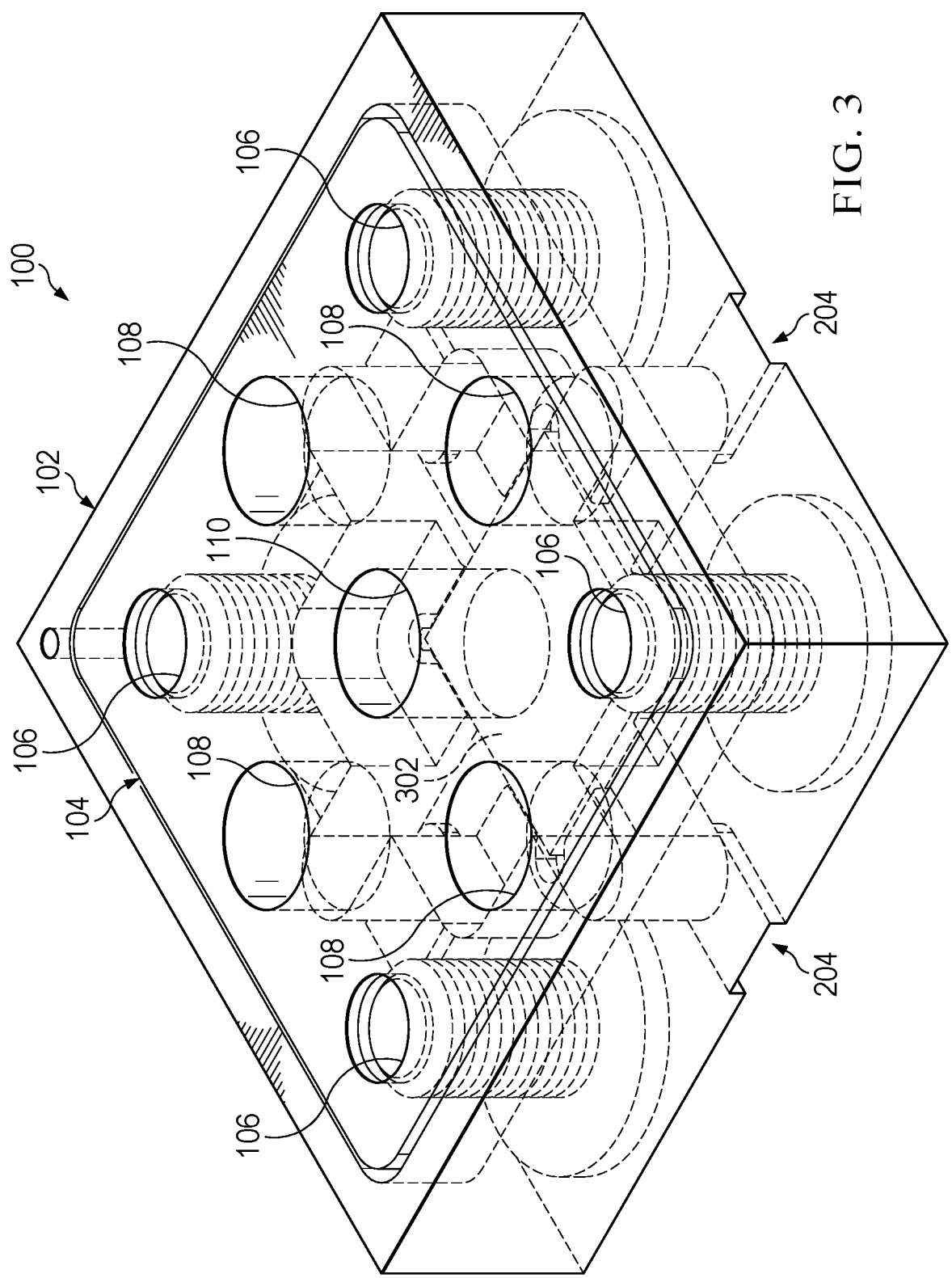
FIG. 3 illustrates a transparent view of the device enclosure.

FIG. 3 illustrates a transparent view of the device enclosure 100 with the base 102 and the cover 104 secured together with screws. The view further shows a WLCSP device 302 inserted into the device enclosure 100. The openings 108 in the cover allow air to access the interior of the device enclosure. Note that the openings 108 and the notches 104 are aligned to allow air to flow between the notches and the openings in the cover.

Figure 4:
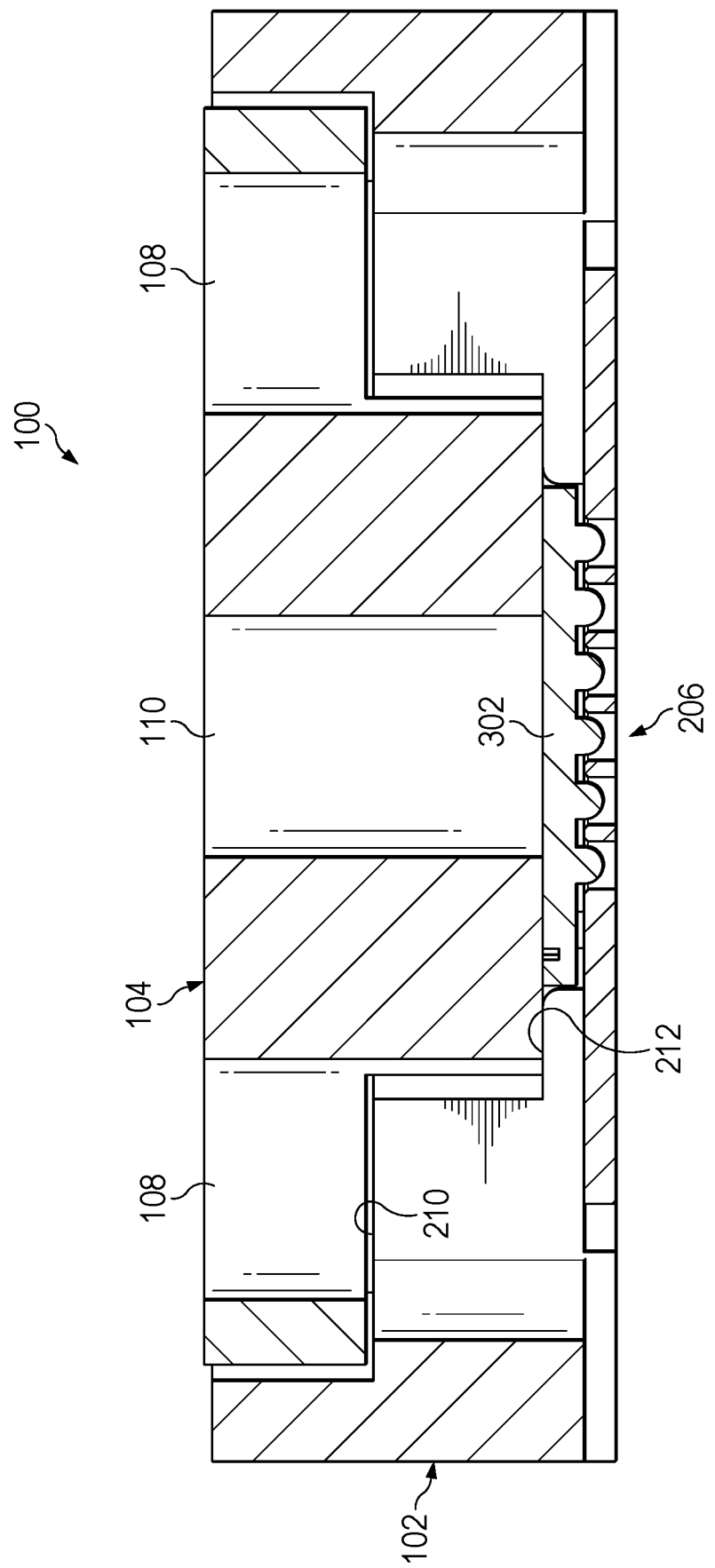
FIG. 4 illustrates a vertical section view through the middle of the device enclosure.

FIG. 4 illustrates a section view through the middle of the device enclosure 100. The section view shows the openings 108 and 110 in the cover 104. FIG. 4 also shows the base 102 with contact holes 206 and the WLCSP device 302 mounted in the device enclosure 100. The center of the cover secures the WLCSP device 302 in the base. FIG. 4 shows that the base 102 provides two support levels for the cover 104. The first support is shown at 210, which supports the peripheral portion of the cover shown in more detail later herein. The second support level is shown at 212 that supports the center portion of the cover also shown in more detail herein.

Figure 5:
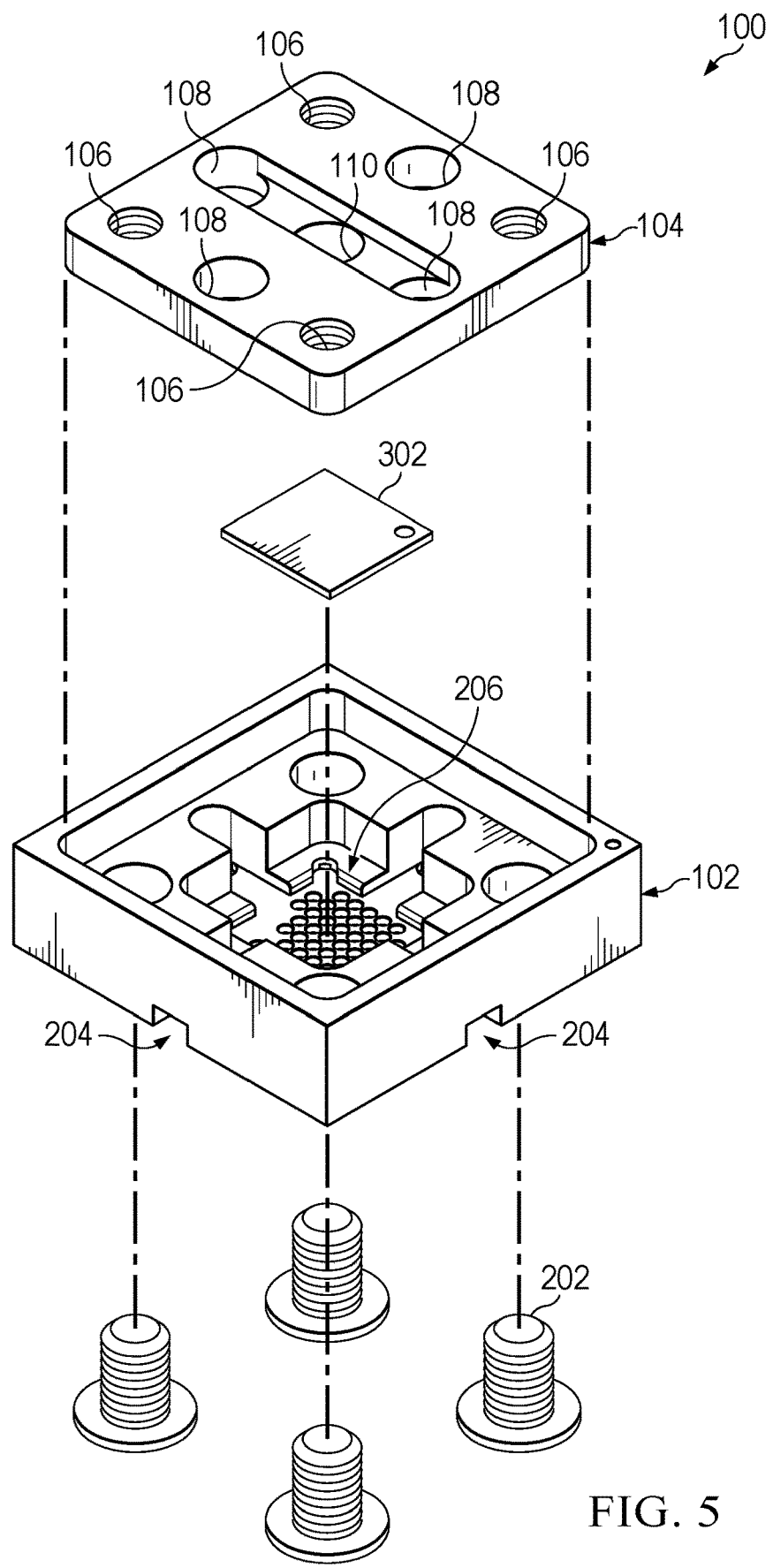
FIG. 5 shows an exploded view of the device enclosure.

FIG. 5 shows an exploded view of the device enclosure 100 including the base 102, the cover 104, the screws 202 and the WLCSP device 302. In the embodiment illustrated in FIG. 5, the cover has a recessed portion in the top in which the center opening 110 and two of the other openings 108 are disposed. The recessed portion helps air flow into the device enclosure. The exploded view also shows the screw holes 106 in the cover, the contact holes 206 in the bottom of the base, and the notches 204 to provide air flow into the base.

Figure 6:
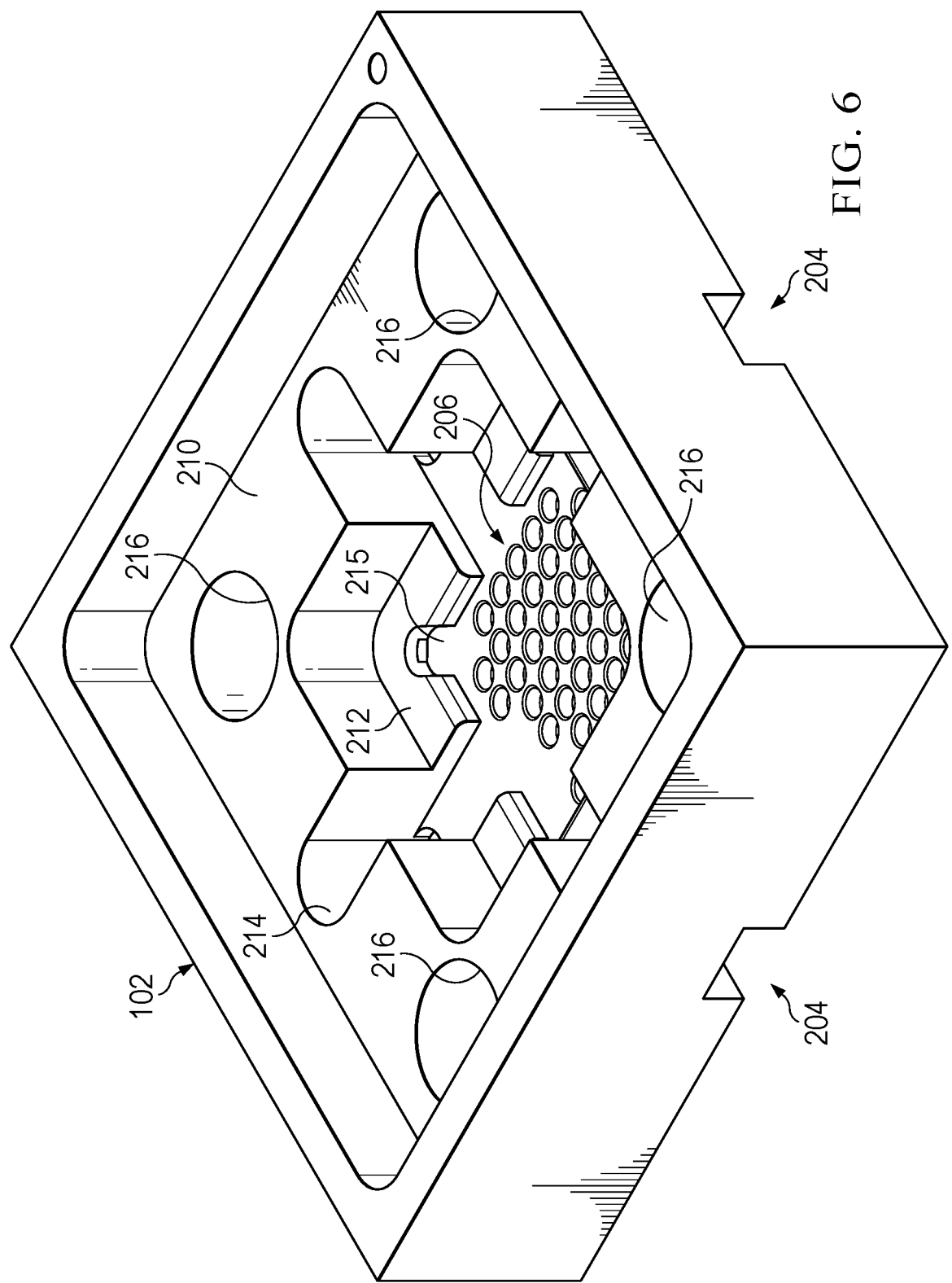
FIG. 6 illustrates a view of the top of the base of the device enclosure.
Figure 7:
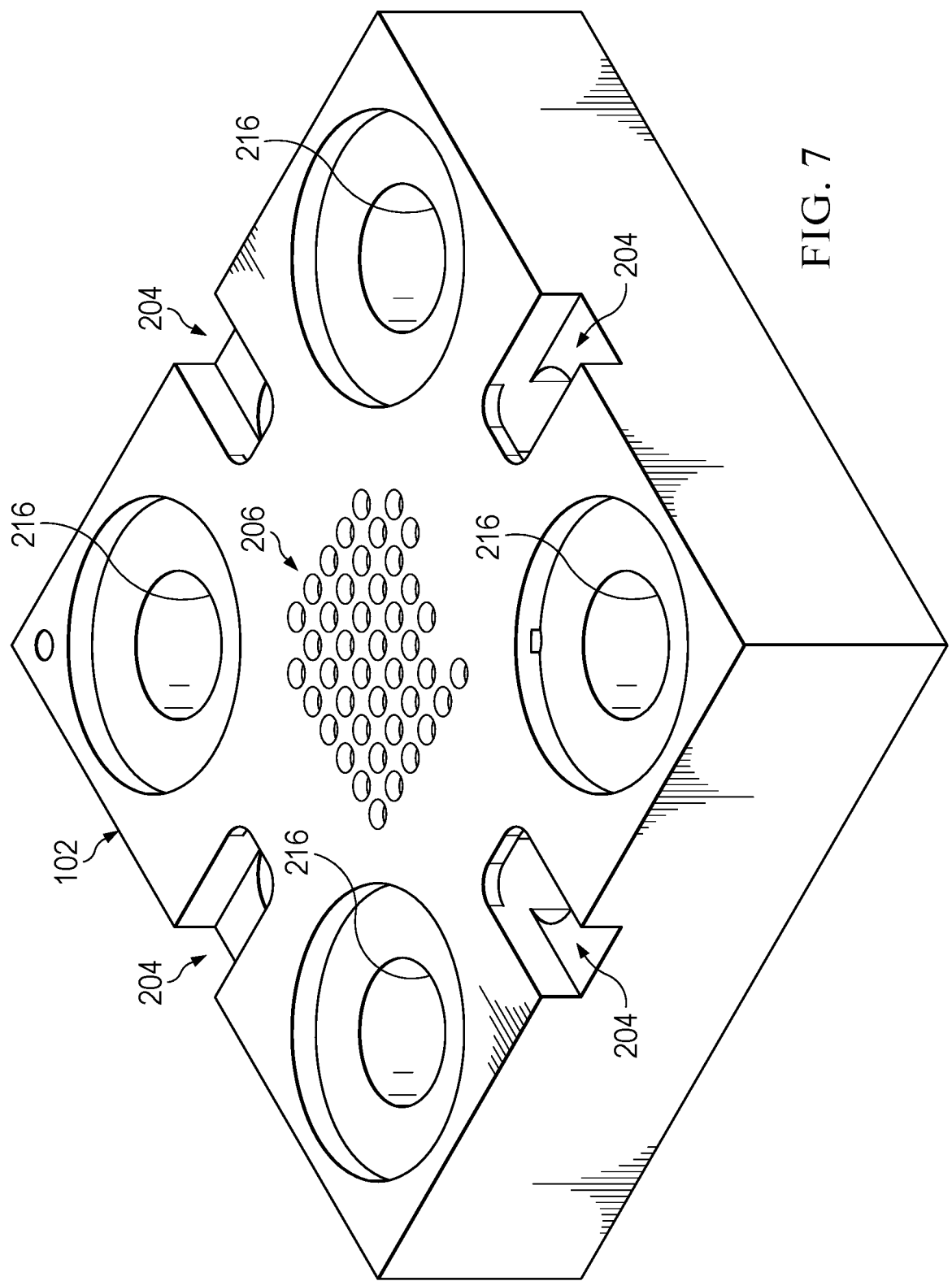
FIG. 7 illustrates a bottom view of the base of the device enclosure.

FIG. 6 shows a view of the top of the base 102 with notches 204 and contact holes 206 for the WLCSP pins. The base 102 provides two support levels for the cover. The first and highest support level is shown at 210 for the peripheral portion of the cover and the second support level for the center portion of the cover is shown at 212. The second support level 212 is aligned with the top of the WLCSP device when the WLCSP device is inserted in the device enclosure. The U-shaped channel 214 couples air from the notch to air from the openings 108 in the cover. The notch and U-shaped channel allow air to be in contact with the side of the WLCSP device when it is inserted in the device enclosure. Note the rounded cutouts 215 in the corner of the lower support 212 that are adjacent to the corners of WLCSP device when inserted. The rounded cutouts 215 provide corner relief. The screw holes 216 in the base are shown in the corner of the base 102. The name of the product can be laser etched, if desired, on the side of the base. FIG. 7 shows a bottom view of the base 102 with notches 204 and contact holes 206 for the WLCSP pins. The screw holes 216 are also visible in this view.

Figure 8:
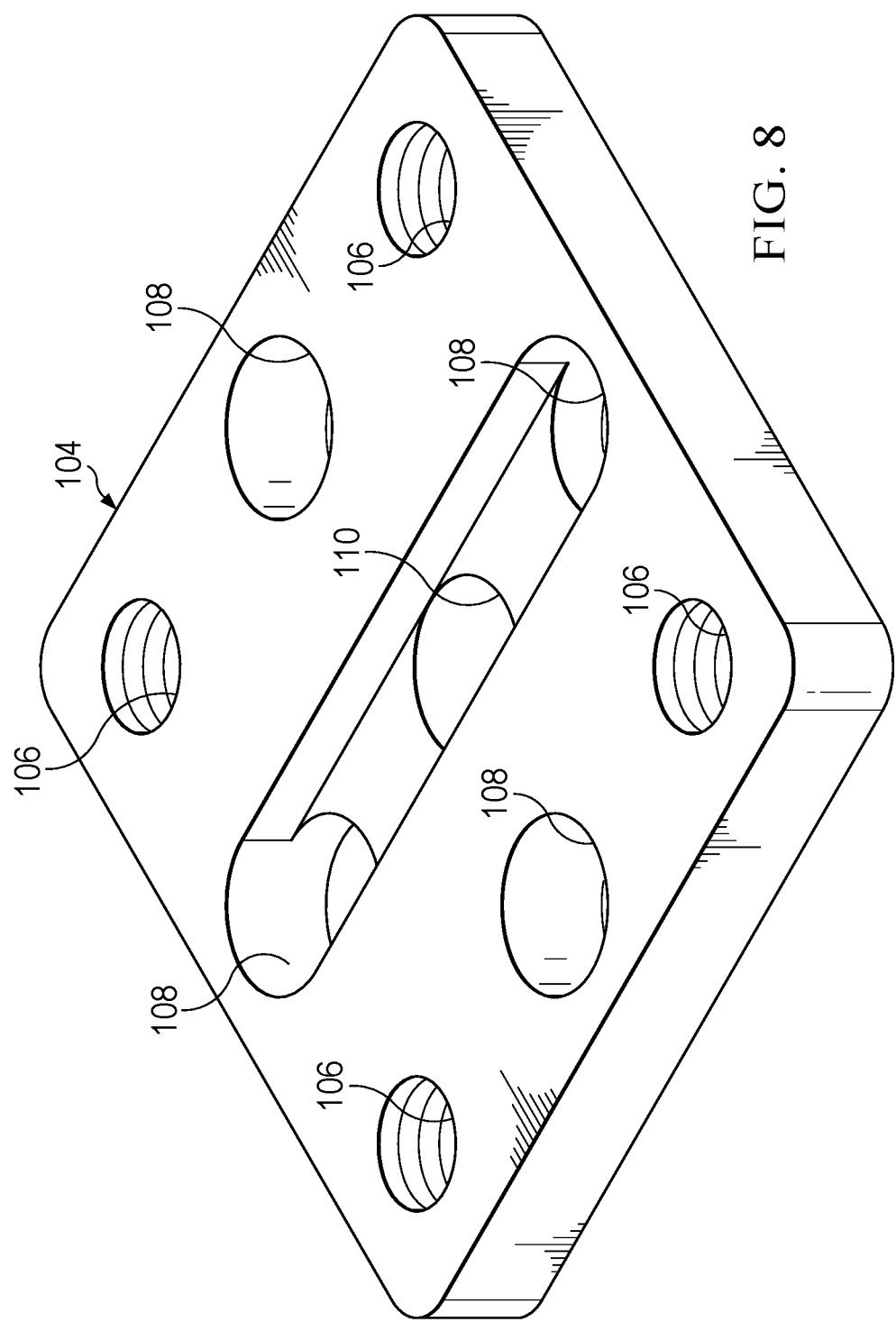
FIG. 8 illustrates a top view of the cover of the device enclosure.
Figure 9:
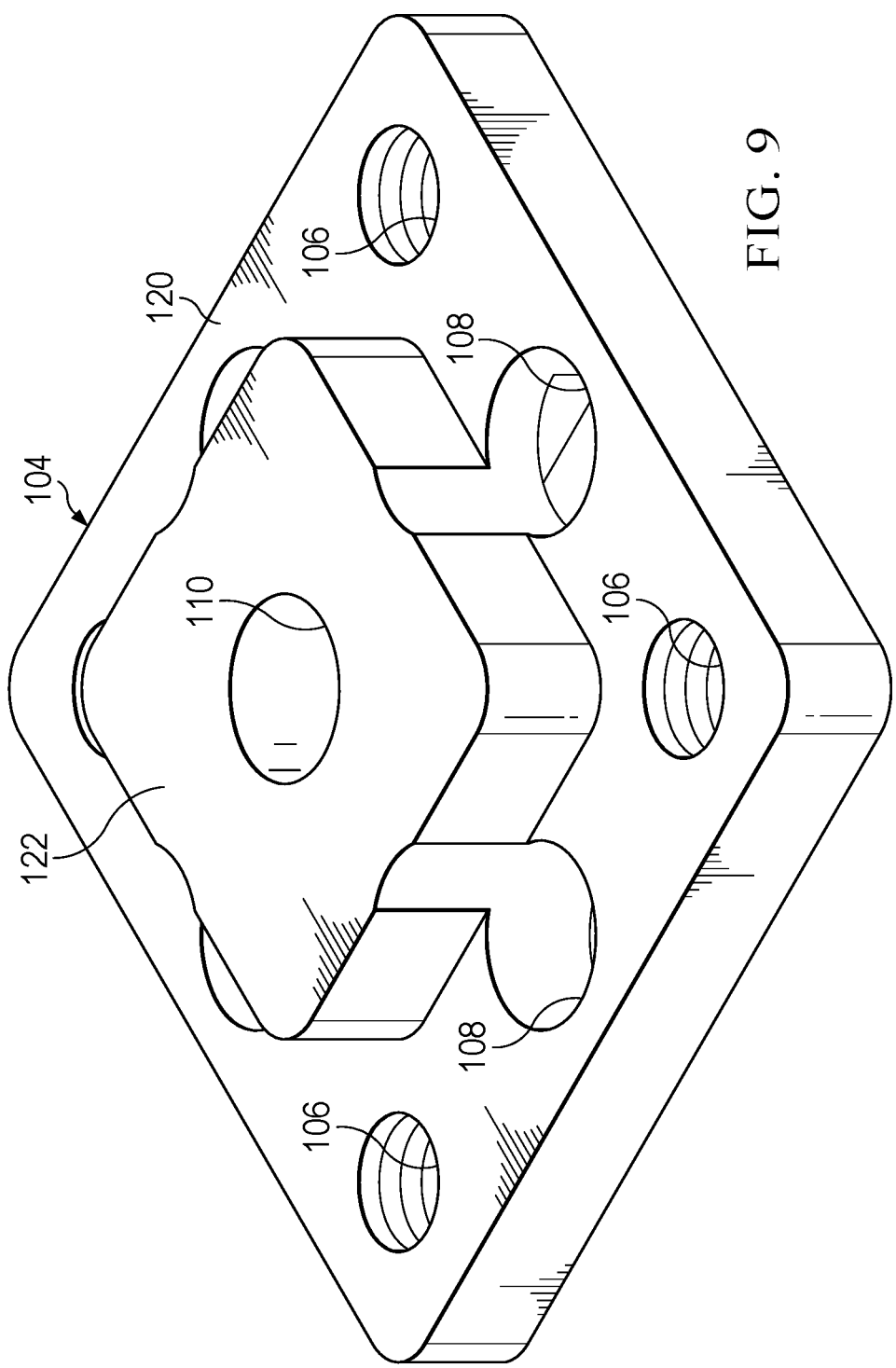
FIG. 9 illustrates a bottom view of the cover of the device enclosure.

FIG. 8 shows a view of the top of the cover 104. The view shows the openings 108, the screw holes 106 and the center opening 110. The name of the product can be laser etched, if desired, on the top of the cover. FIG. 9 shows a view of the bottom of the cover 104. The cover has a peripheral portion 120 that is recessed from the center portion 122. The center portion 122 engages with the top of the WLCSP device to keep the device secure in the device enclosure and also engages with the lower support portion 212 when the WLCSP device is inserted in the base (see FIG. 6). The center opening 110 in the cover allows air to be in contact with the middle of the WLSCP device. The peripheral portion 120 engages with the upper support portion 210 of the base 102 (see FIG. 6). A small portion of openings 108 are formed in the center portion 122.

In an embodiment the device enclosure 100 is intended to support WLCSP devices that are sized as 9×9 mm packages. Of course, other embodiments can support devices of different sizes. In order to support the various thermal testing the WLCSP undergoes for package qualification testing, the device enclosure 100 is made of a material that can sustain high heat and humidity such as high performance semi-crystalline engineering thermoplastic. One such material is polyetheretherketone (PEEK) but other materials that are suitable for the environment may be used.

Thus, a device enclosure for use during package qualification has been described. The description of the invention set forth herein is illustrative and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A device enclosure comprising:
    a base configured to receive a wafer level chip scale package (WLCSP) device, the base including through holes in a bottom of the base to allow electrical contacts of the WLCSP device to be exposed when the WLCSP device is mounted in the device enclosure;
    a cover having a plurality of openings to allow ingress of air during testing; and
    wherein the base and the cover are secured together by screws.

2. The device enclosure as recited in claim 1 wherein the cover includes five openings to provide air to an interior of the device enclosure.

3. The device enclosure as recited in claim 2 wherein one of the five openings is disposed in a center of the cover and four of the five openings are respectively disposed between the center of the cover and an edge of the cover.

4. The device enclosure as recited in claim 3 further comprising a recessed portion on a top of the cover in which three of the five openings are disposed including the one of the five openings disposed in the center of the cover.

5. The device enclosure as recited in claim 2 wherein a peripheral portion of a bottom of the cover is recessed from a center portion of the bottom of the cover.

6. The device enclosure as recited in claim 5 wherein the center portion of the bottom of the cover has the one of the five openings to provide air to the base.

7. The device enclosure as recited in claim 5 wherein the center portion of the bottom of the cover protrudes from the peripheral portion so as to engage the WLCSP device when the WLCSP device is enclosed in the device enclosure and the base and cover are secured together.

8. The device enclosure as recited in claim 5 wherein the center portion of the bottom of the cover extends laterally in a substantially rectangular shape and includes a portion of four of the five openings formed in the cover.

9. The device enclosure as recited in claim 7 wherein the base and the cover each comprise a plurality of screw holes that align to secure the base and cover with the screws.

10. The device enclosure as recited in claim 7 wherein the base includes a base center portion to receive the WLCSP device, the base center portion having the through holes.

11. The device enclosure as recited in claim 10 wherein the base includes a first support portion at a first height from the base center portion to support the center portion of the bottom of the cover.

12. The device enclosure as recited in claim 11 wherein the base includes a second support portion at a second height from the bottom of the base to support the peripheral portion of the bottom of the cover.

13. The device enclosure as recited in claim 12 wherein the second support portion includes channels to align partially with four of the five openings in the cover to provide outside air to sides of the WLCSP device when the WLCSP device is installed in the device enclosure.

14. The device enclosure as recited in claim 13 wherein the base includes notches on each sidewall of the base that are aligned with the channels in the base.

15. The device enclosure as recited in claim 11 wherein the device enclosure is formed of a semi-crystalline thermoplastic material.

16. The device enclosure as recited in claim 11 wherein the device enclosure supports a 9 mm×9 mm device size.

17. A device enclosure for a wafer level chip scale package (WLCSP) device, comprising:
- a base configured to receive the WLCSP device, the base having through holes in a center portion of a bottom of the base to allow electrical contacts of the WLCSP device to be exposed when the WLCSP device is mounted in the device enclosure;
- a cover having a plurality of openings extending vertically from a top of the cover to a bottom of the cover to provide ingress of air into the device enclosure;
- wherein a peripheral portion of the bottom of the cover is recessed from a center portion of the bottom of the cover; and
- wherein the center portion of the bottom of the cover engages the WLCSP device to secure the WLCSP device in the device enclosure when the base and cover are secured together.

18. The device enclosure as recited in claim 17,
- wherein the base includes a first support portion at a first height from the center portion of the base to support the center portion of the bottom of the cover; and
- wherein the base includes a second support portion at a second height from the bottom of the base to support the peripheral portion of the bottom of the cover.

19. The device enclosure as recited in claim 18 wherein the second support portion includes channels to align at least partially with the plurality of openings of the cover.

20. The device enclosure as recited in claim 19 wherein the base includes notches on each sidewall of the base that are aligned with the channels in the base.

* * * * *